United States Patent [19]
Rogers

[11] Patent Number: 5,439,753
[45] Date of Patent: Aug. 8, 1995

[54] ELECTRON EMISSIVE FILM

[75] Inventor: Stephen P. Rogers, Phoenix, Ariz.

[73] Assignee: Motorola, Inc., Schaumburg, Ill.

[21] Appl. No.: 317,061

[22] Filed: Oct. 3, 1994

[51] Int. Cl.⁶ ............................................... B32B 9/00
[52] U.S. Cl. ...................................... 428/688; 427/78;
427/122; 427/249; 427/255.2; 427/577
[58] Field of Search ................. 427/577, 78, 122, 294,
427/249, 255.2

Primary Examiner—Bernard Pianalto
Attorney, Agent, or Firm—Gary F. Witting

[57] ABSTRACT

A method for making an electron emissive film is provided. A substrate and a reaction chamber having a temperature and a pressure is provided. The temperature and the pressure are adjusted to a desired temperature and a desired pressure. A substrate is place into the reaction chamber with hydrocarbon gas being flowed into the chamber. A plasma is ignited in the reaction chamber so as to form a tetrahedral shaped compound in the reaction chamber which aids in deposition of an electron emissive material on the substrate.

22 Claims, 1 Drawing Sheet

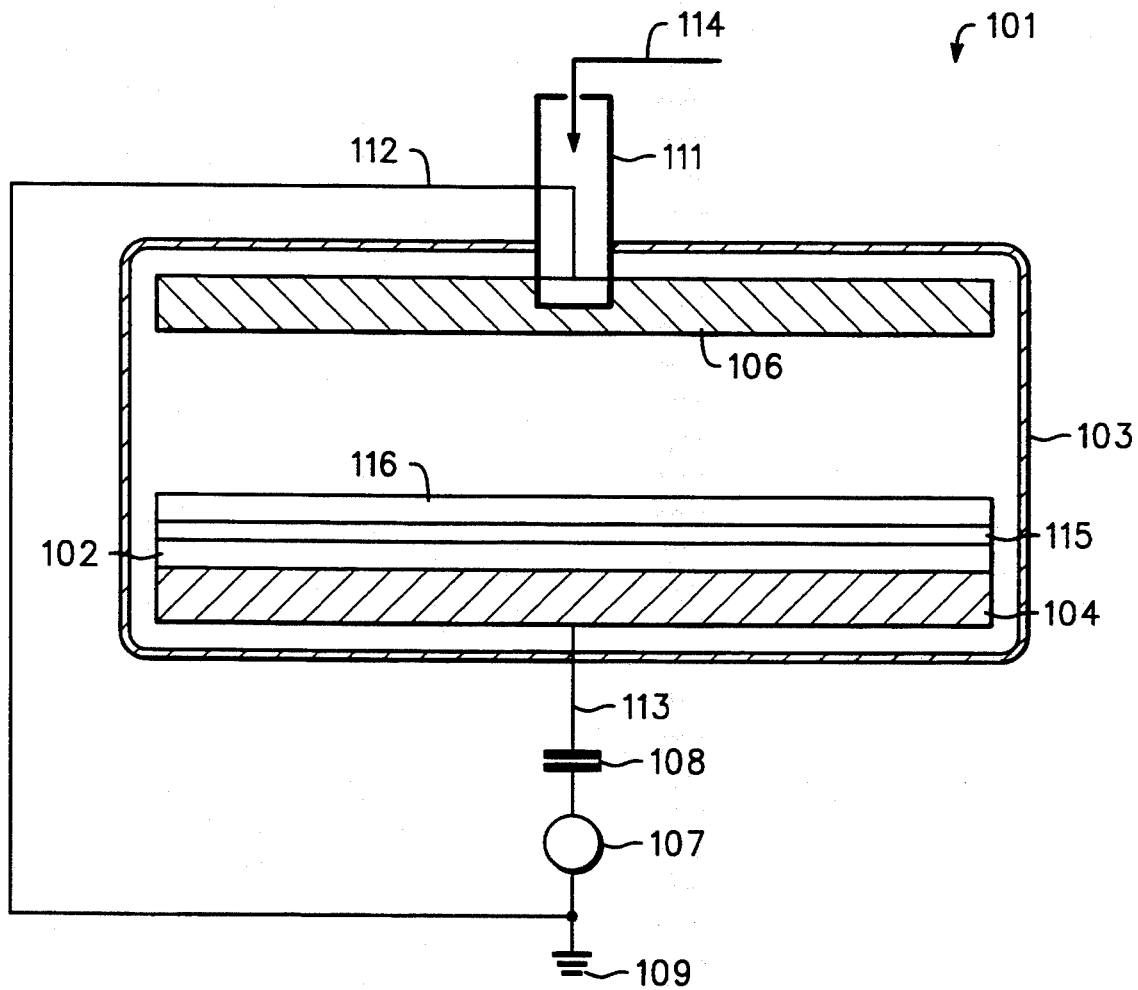

ELECTRON EMISSIVE FILM

FIELD OF THE INVENTION

This invention relates, in general, to diamond like films and, more particularly, to electron emissive diamond like films.

BACKGROUND OF THE INVENTION

Conventional diamond like films (DLF) have been deposited on substrates with a variety of chemical vapor deposition (CVD) techniques and instrumentations. Typically, deposition of the DLF is achieved through use of a hot filament, a microwave, or a radio frequency (RF) chemical vapor deposition (CVD) systems utilizing primarily methane (CH4) and hydrogen (H2) gasses at pressures ranging from 10.0 millitorr to 100.0 tort and at temperatures above 400.0 degrees Celsius. However, while these deposition techniques are suitable for making bulk films that have characteristics similar to diamond itself, these films have not shown electron emissive behavior suitable for electronic device applications.

It was observed by Wang et al. that electron field emission takes place with CVD polycrystalline diamond films, then later recognized in 1991, (Electrn. Lett. 27, (16), 1991, pp. 1459-1461), that such films have a potential use as cold cathode electron sources due to the so called "negative electron affinity". However, while these observations indicated a potential use of polycrystalline diamond films for cold cathode electron sources, these films have severe limitations and problems, such as irregular electron emission, difficult process control, low intensity electron emission, and the like, thus making these films also unsuitable for electronic device applications.

It can be seen that conventional methods for making gem quality or bulk diamond like carbon films are not adequate for making electron sources, especially, cold cathode electron sources. Irregular electron emission, unsuitable manufactureability, low intensity electron emission do not allow conventional bulk films to be used in high volume manufacturing of electron emissive films, thus not enabling such diamond like carbon films to be used in cold cathode electron emission displays. Therefore, a method that improves and solves the problems stated hereinabove would be highly desirable.

SUMMARY OF THE INVENTION

A method for making an electron emissive film is provided. A substrate is provided. A plasma reactor having reaction chamber is provided. The reaction chamber having a temperature and a pressure with the temperature and the pressure being adjustably controlled to a desired temperature and a desired pressure. The substrate is placed in the reaction chamber. Gases including a hydrocarbon gas, hydrogen, and argon are flowed into the reaction chamber. A plasma is ignited forming tetrahedral shaped compounds in the reaction chamber so as to initiate deposition of an electron emissive film on the substrate.

BRIEF DESCRIPTION OF THE DRAWING

In a sole FIGURE, a simplified diagrammatic illustration of a plasma reactor having a substrate is shown.

DETAILED DESCRIPTION OF THE DRAWINGS

In the sole FIGURE, a simplified diagrammatic illustration of a plasma reactor 101 having a substrate 102 placed on a cathode 104 of a reaction chamber 103 is shown. Additionally, substrate 102 is shown with a layer or a film 115 and an electron emissive film (EEF) 116 deposited on substrate 102. Plasma reactor 101 is made of several components, such as cathode 104, an anode 106, a radio frequency (RF) power supply 107, a blocking capacitor 108, a ground 109, a gas injection port 111, and electrical connections 112 and 113. It should be understood that plasma reactor 101 is greatly simplified and that many engineering details have been purposefully omitted so as to make the present invention more clearly understandable. Further, it should be understood that no representation of size or relative size is made in the sole FIGURE.

Generally, plasma reactor 101 is any suitable plasma reactor, such as microwave plasma reactors, downstream plasma reactors, parallel plate plasma reactors, or asymmetric plasma reactors, or the like that is configured to produce a plasma such as an RF plasma, as well as to accept substrate 102. It should be understood that plasma reactor 101 can be configured to accommodate either a single substrate or multiple substrates depending upon specific application of the user.

As shown in the FIGURE, cathode and/or susceptor 104 and anode 106 reside in reaction chamber 103 and are operatively coupled to RF power supply 107 through electrical lead or electrical connection 112 and electrical lead or electrical connection 113 with blocking capacitor 108 placed between cathode 104 and RF power supply 107. However, it should be understood that in some plasma reactors anode 106 is incorporated into reaction chamber 103.

Gas injection port 111 provides an opening for a gas or gases, illustrated as arrow 114, with a controlled flow to enter reaction chamber 103, thereby filling reaction chamber 103 with gas 114.

Also, a vacuum system (not shown) is connected to reaction chamber 103, thereby enabling reaction chamber 103 to be exhausted. Typically, in association with the vacuum system, a pressure controlling device (not shown), such as a butterfly valve (not shown) is used to precisely control the pressure in reaction chamber 103.

In the present invention, substrate 102 is made of any suitable material, such a dielectric material, e.g., glass ($SiO_2$), silicon nitride ($Si_3Ni_4$), plastic, or the like, a conductive material, e.g., aluminum (Al), chromium (Cr), steel, tungsten (W), titanium (Ti), or the like, or a semiconductor material, e.g., silicon, gallium arsenide, or the like. Further, substrate 102 can be manufactured with a layer or film 115 such as W, Ti, Al that is disposed or deposited on substrate 102, thereby enhancing formation of EEF 116. Typically, layer 115 is disposed or applied to substrate 102 by any suitable method, such as evaporation, sputtering, or the like. Further, by providing substrate 102 with multiple layers, electrically active devices such as field emission devices (FED's) are manufactured.

In function, once substrate 102 is placed in reaction chamber 103 and once gas 114 has entered reaction chamber 103 through gas injection port 111, RF power supply 107 provides an RF voltage to the gas between cathode 104 and anode 106 that ionizes the gas, thereby generating a glow discharge or a plasma therebetween.

Typically, substrate 102 is placed so that at least a portion of substrate 102 is near or in the plasma, thus allowing the plasma to interact with substrate 102. For example, as illustrated in the FIGURE, substrate 102 is placed on cathode or susceptor 104, thereby allowing the plasma to interact with substrate 102. The ionized gas includes an equal number of positive and negative charges, and a different amount of unionized neutral molecules. The plasma also contains a population of free radicals. Free radicals are atoms or molecules that are electrically neutral but, exhibit incomplete chemical bonding, thus making a free radical highly reactive species.

In the present invention, process parameters, i.e., temperature, pressure, direct current (DC) bias, power, and gasses are defined that promote deposition of electron emissive film 116. Temperature typically measured at substrate 102 ranges from 0.0 to 600.0 degrees Celsius, with a preferred temperature ranging from 0.0 to 80.0 degrees Celsius, and a nominal temperature on the order of 20.0 degrees Celsius. Pressure in reaction chamber 103 ranges form 1.0 millitorr to 5.0 torr, with a preferred range from 12.0 to 100 millitorr, having nominal range from 15.0 to 20.0 millitorr, and a nominal value of 18.0 millitorr.

DC bias, which is a measure of potential voltage between cathode 104 and anode 106, is determined through interactions of a variety of process parameters, such as pressure in reaction chamber 103, power from RF power supply 107, spacing between cathode 104 and anode 106, and the like. Thus, while DC bias indicates the potential between cathode 104 and anode 106, it should be understood that DC bias varies with other process parameters. It should be further understood that in some plasma reactors the DC bias can be selectively fixed or chosen to an arbitrary value while other process parameters self-adjust or float so as to allow the chosen or fixed DC bias to be realized. Generally, DC bias can range from 5.0 to 600.0 volts direct current (VDC), with a preferred range from 400.0 to 550.0 VDC, with a nominal value on the order of 523 VDC.

Power typically measured as Watts is an output level from RF power supply 107 ranges from 25.0 to 1000.0 watts, with a preferred level ranging from 200.0 to 500.0 Watts, and a nominal level on the order of 300.0 Watts.

In the present invention, a combination of gases is used to ignite the glow discharge in reaction chamber 103 to form or deposit EEF 116 on substrate 102. The combination of gases includes a hydrocarbon gas, hydrogen, and argon having flow rates ranging from 2 to 10 sccm, 5 to 50 sccm, and 5 to 20 sccm; with a preferred range from 4 to 8 sccm, 10 to 30 sccm, and 10 to 15 sccm; with a nominal range from 5 to 7 sccm, 15 to 25 sccm, and 8 to 13 sccm, respectively.

More specifically, the hydrocarbon gas includes a tetrahedral molecular arrangement whose conformation either in the plasma or on substrate 102 initiates deposition of EEF 116. Hydrocarbon gases that exhibit this tetrahedral molecular arrangement include methane, ethane, propane, butane, trimethyl gallium, triethyl gallium, trimethyl indium, triethyl indium, tetramethyl germanium, tetraethyl germanium, tetramethyl tin, tetraethyl tin, trimethyl boron, triethyl boron, trimethyl aluminum, and triethyl aluminum, and the like. Additionally, it should be understood by one of ordinary skill in the art that other homologues and analogs are usable.

It should be understood that specific values for temperature, pressure, DC bias, and power, and gas flows change with specific types and configurations of plasma reactor 101.

While reactions in the plasma itself are very complicated, basic mechanisms can be represented by the following generalized formulas:

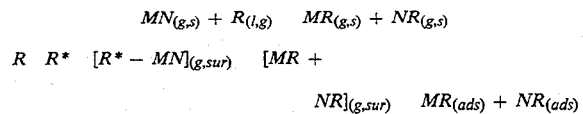

where $k = k_1 + k_2 + k_3 + k_4$ $k_1$ = rate constant for the generation of reactive gas species;

$k_2$ = diffusion rate constant for gas phase reaction or combined diffusion and chemisorption rate constant for surface reaction;

$k_3$ = chemical reaction rate constant for gas phase or surface reactions;

$k_4$ = physisorption rate constant for surface reaction or physisorption rate constant for gas phase products;

$MN_{(g,s)}$ = gas phase or solid material;

$R^*$ = reactive or activated gas species;

$MR_{(g,s)}$ = deposition component one;

$NR_{(g,s)}$ = deposition component two.

First, generation of free radicals or reactive or activated deposition species $R^*$ are formed from a gas or gases R in the plasma. Generation of reactive or activated deposition species $R^*$ from gas or gases R is at a rate indicated by $k_1$. Reactive or activated deposition species may be free radicals, ions, or neutrals. These reactive or activated deposition species $R^*$ are continually replaced or formed in the plasma in order for the reaction to continue to the right. If reactive or activated gas species $R^*$ is not continuously formed in the plasma, the reaction becomes starved and eventually stops.

Second, reactive or activated species $R^*$ travels from the plasma to the surface of the material that it is to be deposited on, and the rate at which this occurs is included as part of rate constant $k_2$.

Third, once the deposition species $R^*$ are diffused to the surface (sur), they can be chemisorbed onto surface MN. Chemisorption is a binding energy which usually leads to the formation of new bonds. Chemisorption is also part of rate constant $k_2$. The solid surface that is illustrated in the generalized formulas, shown hereinabove, as MN can be any suitable material. However, in the present invention, by placing a trace amount of a metal or semiconductor, such as titanium (Ti), tungsten (W), geranium (Ge), gallium (Ga), indium (In), tin (Sn), or alloys thereof, such as titungsten (TiW) having a composition of (W 95%/Ti 5%) into the reaction chemistry, EEF 116 is seeded and initiates deposition on substrate 102. By exposing the plasma to layer 115 made of materials, such as titanium (Ti), tungsten (W), geranium (Ge) , gallium (Ga) , indium (In) , tin (Sn) , or alloys thereof, such as titungsten (TiW) having a composition of (W 95%/Ti 5%) enhances deposition of electron emissive film 116 by initiating a tetrahedral conformational compound either in the plasma or on substrate 102. It is believed that the tetrahedral compound seeds either the plasma or substrate 102 to promote disjoint or small domains having sp3 bonding characteristics of carbon that forms electron emissive film 116, thereby generating a superior electron emissive film 116.

Fourth, a chemical reaction takes place between the chemisorbed deposition species R* and the solid material MN. The rate at which this occurs is described by the chemical reaction rate constant $k_3$. It is at this point that chemical bonds are changing to form the deposition products.

Fifth, deposition products MR and NR are fully formed and are the end result of a chemical reaction. These deposition products are held closely to the surface by physisorption forces (ads), which is described by constant $k_4$. Physisorption forces are effects caused by electrical interaction between two bodies such as van der Waals forces.

Reaction rate constants $k_2$ and $k_3$ are chemical transitional states between initial contact of deposition species R* and solid material MN, and deposition products MR and NR. These transitional states occur very quickly and are very difficult to measure.

By way of example, with substrate 102 being silicon, with layer 115 being a composite material of TiW having a thickness of 1,500 Angstroms and patterned in stripes with gallium having a thickness of 50 Angstroms disposed thereon, the substrate was placed on cathode 104 of parallel plate plasma reactor 101. Temperature of cathode 104 and walls of reaction chamber were controlled to 20.0 degrees Celsius and 35.0 degrees Celsius, respectively. Methane, hydrogen, and argon gases were flowed into reaction chamber 103 through mass flow controllers at a rate of 6, 20, and 12 standard cubic centimeters per minute (sccm), respectively. Pressure was controlled at 30.0 millitorr. A plasma with these conditions was initiated at 300.0 watts RF power at a frequency of 13.56 MHz and the pressure in reaction chamber was reduced to 18.0 millitorr which resulted in a DC bias of −525 volts. After a period of time, electron emissive film 116 was deposited on substrate 102. Electron emissive film 116 having superior electron emissive characteristics, as well as being uniform in deposition was deposited on substrate 102, thus enabling a cost effective, high quality, manufacturable electron emissive film 116 to be made.

Thus, in accordance with the present invention, a simple, reliable, and low cost method for manufacturing an electron emissive film is provided. The present invention provides reliable electron emissive films suitable for electronic devices. The present invention uses a conventional plasma reactor, thereby reducing the cost of manufacture, as well as integrating the electron emissive film with other electronic films.

What is claimed is:

1. A method for making an electron emissive film comprising the steps of:
   providing a substrate;
   providing a plasma reactor having a reaction chamber, the reaction chamber having a temperature and a pressure, wherein the temperature and the pressure are adjustably controlled to a desired temperature and a desired pressure;
   placing the substrate in the reaction chamber;
   flowing gases that include a hydrocarbon gas into the reaction chamber;
   igniting a plasma in the plasma reactor;
   forming a tetrahedral shaped compound in the plasma reactor; and
   depositing an electron emissive film on the substrate.

2. A method for making an electron emissive film as claimed in claim 1 where, in the step of providing the reaction chamber, the reaction chamber is a parallel plate reaction chamber.

3. A method for making an electron emissive film as claimed in claim 1 where, in the step of providing the substrate, the substrate is a dielectric.

4. A method for making an electron emissive diamond film as claimed in claim 1 where, in the step of providing a substrate, the substrate is a conductor.

5. A method for making an electron emissive film as claimed in claim 1 where, in the step of flowing the hydrocarbon gas, the hydrocarbon gas is selected from a group comprising: methane, ethane, propane, butane, trimethyl gallium, triethyl gallium, trimethyl indium, triethyl indium, tetramethyl germanium, tetraethyl germanium, tetramethyl tin, tetraethyl tin, trimethyl boron, triethyl boron, trimethyl aluminum, and triethyl aluminum.

6. A method for making an electron emissive film as claimed in claim 1 where, in the step of forming a tetrahedral compound in the reaction chamber, the tetrahedral compound is formed by introducing a trace amount of material from a group consisting of: gallium, indium, tin, and germanium.

7. A method for making an electron emissive film as claimed in claim 1 where, in the step of providing the plasma reactor with the reaction chamber, the desired temperature is adjusted to a range from 0.0 to 600.0 degrees Celsius.

8. A method for making an electron emissive film as claimed in claim 7 wherein the desired temperature is adjusted to a preferable range from 0.0 to 80.0 degrees Celsius.

9. A method for making an electron emissive film as claimed in claim 8 wherein the desired temperature is adjusted to a nominal temperature of 20.0 degrees Celsius.

10. A method for making an electron emissive film as claimed in claim 1 where, in the step of providing the plasma reactor with the reaction chamber, the desired pressure is adjusted within a range from 1.0 millitorr to 5.0 torr.

11. A method for making an electron emissive film as claimed in claim 10 wherein the desired pressure is adjusted to a preferable range from 12.0 millitorr to 100.0 millitorr.

12. A method for making an electron emissive film as claimed in claim 11 where in the desired pressure is adjusted to a nominal range from 15.0 to 20.0 millitorr.

13. A method for making an electron emissive material comprising the steps of:
   providing a substrate;
   providing a plasma chemical vapor deposition system having a reaction chamber, the plasma chemical vapor deposition system including a susceptor in the reaction chamber for holding the substrate, a temperature controlling system to adjust the substrate to a desired temperature ranging from 10.0 to 80.0 degrees Celsius, and a pressure controlling system to adjust the reaction chamber to a desired pressure ranging from 10.0 millitorr to 100.0 millitorr;
   placing the substrate on the susceptor of the reaction chamber;
   flowing a hydrocarbon gas, a hydrogen gas, and an argon gas into the reaction chamber;
   generating a plasma in the reaction chamber of the plasma chemical vapor deposition system to form a tetrahedral shaped compound that seeds the reaction chamber and the substrate; and depositing an electron emissive film on the substrate.

14. A method for making an electron emissive material as claimed in claim 13 where, in the step of providing a substrate, the substrate is a dielectric.

15. A method for making an electron emissive material layer as claimed in claim 13 where, in the step of providing a substrate, the substrate is a conductor.

16. A method for making an electron emissive material layer as claimed in claim 13 where, in the step of providing a substrate, the substrate is a semiconductor.

17. A method for making an electron emissive material layer as claimed in claim 13 where, in the step of flowing a hydrocarbon gas, the hydrocarbon gas is selected from a group comprising of methane, ethane, propane, butane, trimethyl gallium, triethyl gallium, trimethyl indium, triethyl indium, tetramethyl germanium, tetraethyl germanium, tetramethyl tin, tetraethyl tin, trimethyl boron, triethyl boron, trimethyl aluminum, and triethyl aluminum.

18. A method for making an electron emissive material layer as claimed in claim 13 where, in the step of generating a plasma in the reaction chamber, the tetrahedral shaped compound is formed by having a trace amount of material from a group comprising gallium, indium, tin, and geranium.

19. A method for making an electron emissive diamond like material layer as claimed in claim 13 wherein the desired temperature is adjusted to 20.0 degrees Celsius.

20. A method for making an electron emissive diamond like material layer as claimed in claim 13 wherein the desired pressure is adjusted to a range from 15.0 to 20 millitorr.

21. A method for making an electron emissive material comprising the steps of:

providing a substrate having a surface with a layer adhered thereto;

providing a plasma chemical vapor deposition system having a reaction chamber, the plasma chemical vapor deposition system including a susceptor in the reaction chamber for holding the substrate, a temperature controlling system to adjust the substrate to a desired temperature ranging from 10.0 to 80.0 degrees Celsius, and a pressure controlling system to adjust the reaction chamber to a desired pressure ranging from 10.0 millitorr to 100.0 millitorr;

placing the substrate in the reaction chamber of the plasma chemical vapor deposition system;

flowing a hydrocarbon gas into the reaction chamber;

generating a plasma in the reaction chamber of the plasma chemical vapor deposition system;

inducing a tetrahedral conformational compound from the layer on the surface of the substrate so as to seed the surface of the substrate; and depositing an electron emissive material on the substrate.

22. An electron emissive film comprising:

a substrate having a surface; and an electron emissive film having disjoint small domains of carbon with sp3 bonding disposed on the substrate.

* * * * *